United States Patent [19]

Sievers et al.

[11] Patent Number: 4,670,714

[45] Date of Patent: Jun. 2, 1987

[54] PROGRAMMABLE OUTPUT POLARITY DEVICE

[75] Inventors: William H. Sievers, Mountain View; Marc S. Garrett, Santa Clara, both of Calif.

[73] Assignee: Advanced Micro Devices, Inc., Sunnyvale, Calif.

[21] Appl. No.: 682,381

[22] Filed: Dec. 17, 1984

[51] Int. Cl.⁴ ............................................. G01R 19/14
[52] U.S. Cl. ..................................... 324/133; 307/262; 371/15
[58] Field of Search ........................... 324/133, 73 PC; 307/262, 471; 328/118; 361/245, 246; 364/716; 371/25, 21, 15

[56] References Cited

U.S. PATENT DOCUMENTS 4,527,115  7/1985  Mehrotra et al. .......... 324/73 PC X
4,533,841  8/1985  Konishi ....................... 307/471

FOREIGN PATENT DOCUMENTS 0211822  12/1982  Japan ................................. 307/262

Primary Examiner—Reinhard J. Eisenzopf
Assistant Examiner—Jack B. Harvey
Attorney, Agent, or Firm—Patrick T. King; Mark A. Haynes

[57] ABSTRACT

An apparatus for generating an output signal having a selected output polarity. The apparatus comprises a sensing means for generating a logic signal upon occurrence of an event. Also, a programmable means generates a programmable signal indicating a selected output polarity. The logic signal and the programmable signal are received by polarity setting means for producing an output signal equal to the logic signal with the selected output polarity. Also disclosed is a testing means for temporarily forcing the programmable signal to indicate a selected output polarity for testing.

17 Claims, 3 Drawing Figures

PROGRAMMABLE OUTPUT POLARITY DEVICE

FIELD OF THE INVENTION

The present invention relates to the field of controlling the polarity of output logic signals. Particularly, the present invention involves an apparatus for adapting logic circuitry to operate in either an active-high or active-low mode.

BACKGROUND OF THE INVENTION

Typically, logic circuitry operates by generating signals having one of two levels corresponding to the one and zero of binary logic. The two levels include a low level and a high level. Logic circuitry operating in this manner can be characterized as operating in the active-low or active-high modes.

In the active-low mode, the logic circuitry generates a low-level signal in response to a positive event. Conversely, in the active-high mode, the logic circuitry generates a high-level signal in response to a positive event.

The selection of either active-low or active-high modes is termed the selection of the polarity of the logic signal. In particular implementations of logic circuitry, the selection of one or the other polarity can result in simplification of the circuitry necessary for a given function. For instance, for a given function, an active-low logic circuit may require fewer logic gates to accomplish the function than would be required if the logic circuit were designed to operate in the active-high mode.

The ability to programmably select the output polarity of a given logic circuit results in increased flexibility of design for a user of a logic circuit. For example, field-programmable logic arrays can be made more flexible and therefore more adaptable to particular logic functions, by providing the ability to programmably select the output polarity of the outputs from the array.

Most devices, such as logic arrays, in which programmably selectable output polarity is useful, operate very rapidly. So propagation delays through a circuit providing programmable output polarity must be minimized to avoid diminished performance that may limit the range of usefulness of the device.

In addition, the ability to test the operation of the output polarity setting circuitry is desirable to provide more reliable devices. Without the ability to test, it may be difficult to determine whether the logic circuit employing the output polarity selecting circuitry is operating reliably in the desired output polarity.

In sum, there is a need for devices having programmable output polarity that are testable and fast. The flexibility and reliability of circuits employing such devices will thereby be enhanced.

SUMMARY OF THE INVENTION

The present invention provides an apparatus for generating an output signal in response to a logic event having a selected output polarity that is fast and provides the ability to test the operation of the apparatus.

The present invention comprises sensing means for generating logic signal upon the occurrence of an event. Also included is a programmable means for generating a programmable signal indicating a selected output polarity for the output signal. A polarity setting means, receiving the logic signal and the programmable signal, produces an output signal equal to the logic signal with the selected output polarity.

The preferred embodiment also includes an output driver circuit for driving the output signal at a level suitable to run other logic circuitry.

In another aspect, the present invention provides a testing means for temporarily forcing the programmable signal to indicate one output polarity for testing the polarity setting means.

DETAILED DESCRIPTION

With reference to the Figures, a detailed description of the present invention is provided. First, an overview of the invention is discussed. Then a particular circuit implementation for the preferred embodiment is described. Finally, a field programmable logic array device employing the present invention is described.

Figure 1:
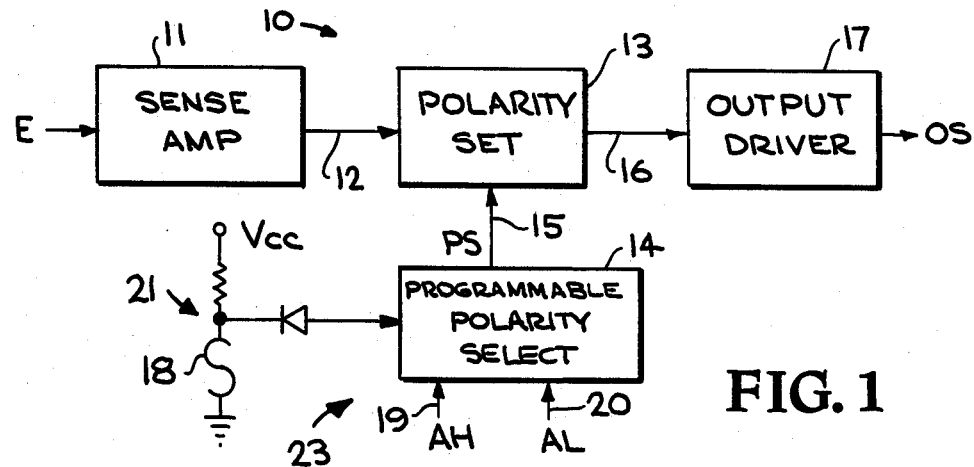
FIG. 1 is a block diagram of an apparatus according to the present invention.

In FIG. 1, a block diagram of the present invention is provided. The invention provides an apparatus 10 for providing an output signal OS in response to the occurrence of an event E.

The apparatus 10 comprises a sensing means 11 for generating a logic signal on line 12 upon occurrence of the event E. A programmable polarity selecting means 14 for generating a programmable signal PS indicating a selected polarity of active-high or active-low is included. The programmable signal PS is generated across line 15.

A polarity set means 13 receives the logic signal on line 12 and the programmable signal on line 15 and sets the polarity of the output signal OS in response. The signal generated by the polarity set means 13 is equal to the logic signal 12 having the selected polarity indicated by the programmable signal. This output signal is supplied on line 16 to an output driver means 17 for driving the output signal OS at a level suitable to run other logic circuitry or other device responsive to the output signal OS.

Also included is a means 21 for programming the programmable polarity select means 14, such as field programmable fuse 18. The field programmable fuse 18 is provided as one example of the means 21 for programming the programmable polarity select means 14. Other means 21 for programming the programmable polarity select means 14 may be utilized as suits the particular use of the apparatus 10.

The programmable polarity select means 14 shown in FIG. 1 also includes means 23 for testing the polarity set means 13. Upon reception of a signal on line 19, the programmable signal is set to indicate an active-high mode, thereby causing the polarity set means 13 to generate an active-high output signal OS. Also, upon generation of a signal on line 20, the programmable polarity select means 14 is forced to indicate an active-low mode through the programmable signal on line 15. This causes the polarity set means 13 to provide an active-low output for testing. The testing signals are applied temporarily and allow the programmable polarity select means 14 to respond to the means 21 for programming, such as the field programmable fuse 18, upon discontinuation of the testing signals.

Figure 2:
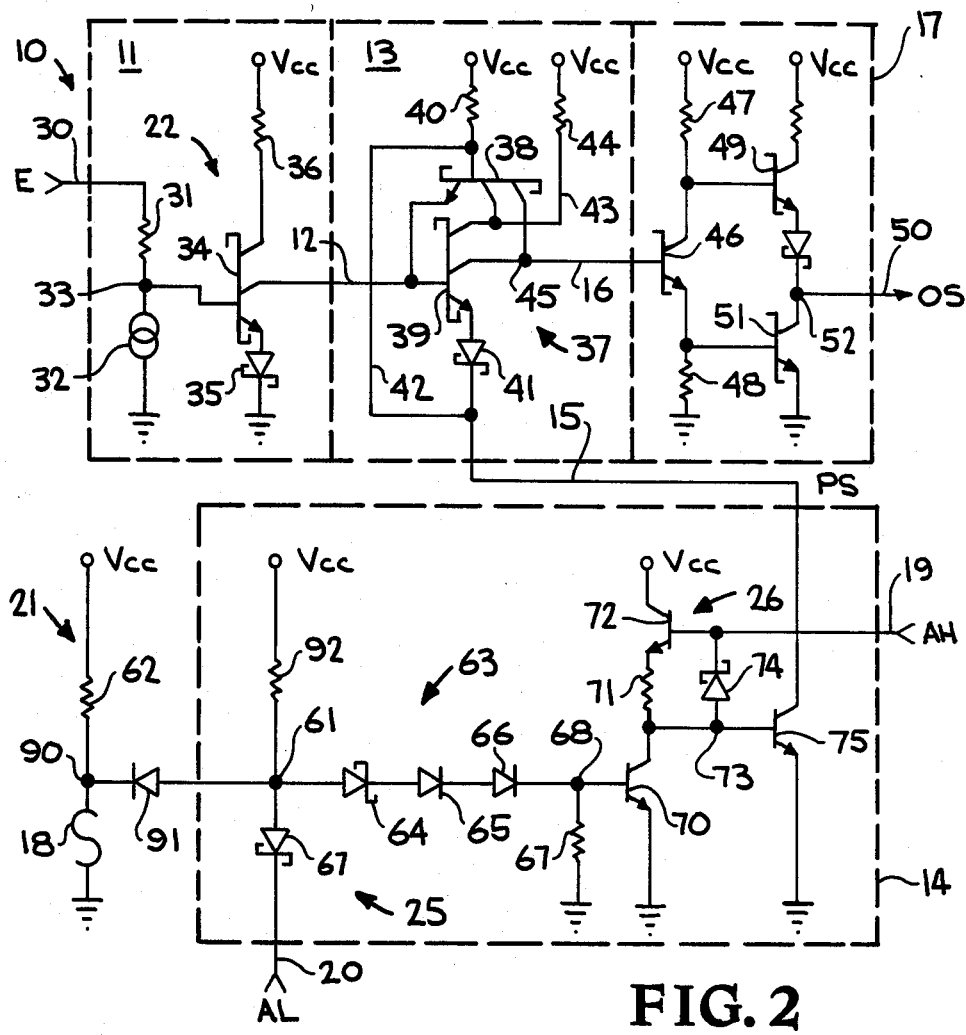
FIG. 2 is a circuit diagram showing a preferred implementation of the present invention.

A circuit diagram of a preferred embodiment of the apparatus 10 is shown in FIG. 2. The portions of the circuit shown in FIG. 2 which correspond to the block diagram of FIG. 1 are outlined in dashed lines and numbered to correspond with the blocks of FIG. 1.

The sensing means 11 in the embodiment of FIG. 2 is adapted to sense the change in level of the output of an emitter follower output of a logic gate (not shown) on line 30. The output of the emitter follower is supplied to line 30. The sensing means 11 comprises an inverting transistor means 22 for generating a logic signal on line 12 in response to a signal on line 30. By responding to swings of a few hundred millivolts in the output level of the emitter follower, the sensing means 11 switches the transistor means 22 between its on and off condition.

The sensing means 11 includes a resistor 31 connected from line 30 to node 33 and a current source 32 from node 33 to ground. Changes in the output of the gate on line 30 will be reflected as changes in the level of the node 33 between the resistor 31 and the current source 32. The node 33 is connected to the base of a dual collector transistor 34. The emitter of the dual collector transistor 34 is connected to the anode of a Shottky diode 35. The cathode of the Shottky diode 35 is connected to ground. The first collector of the dual collector transistor 34 is connected through a resistor 36 to a reference voltage $V_{cc}$. The second collector of the dual collector transistor 34 is provided over line 12 as the logic signal provided by the sensing means 11.

The sensing means 11 shown in FIG. 2 inverts the signal supplied over line 30. Thus, if the signal on line 30 is high, the logic signal on line 12 will be a low signal. However, if the signal on line 30 is low, the dual collector transistor 34 will be off causing the logic signal on line 12 to be high.

The logic signal on line 12 is provided to the polarity set means 13. The polarity set means 13 comprises a transistor means 37 for generating an exclusive NOR output signal on line 16. The first input to the exclusive NOR transistor means 37 is the logic signal on line 12. The second input to the transistor means 37 is the programmable signal on line 15. The transistor means 37, in the preferred embodiment, includes a first dual collector transistor 38 and a second dual collector transistor 39.

The base of the first dual collector transistor 38 is connected through a resistor 40 to the reference voltage $V_{cc}$. The emitter of the first dual collector transistor 38 is connected to the line 12 for receiving the logic signal. The programmable signal is delivered across line 42 to the base of the first dual collector transistor 38.

The base of the second dual collector transistor 39 is connected to the line 12 for receiving the logic signal. The emitter of the second dual collector transistor 39 is connected through Shottky diode 41 to the line 15 for receiving the programmable signal.

The first collector of the first dual collector transistor 38 and the first collector of the second dual collector transistor 39 are connected to node 43 which is connected through resistor 44 to the reference voltage $V_{cc}$. The second collector of the first dual collector transistor 38 and the second collector of the second dual collector transistor 39 are connected to a common node 45 that is connected to the output line 16 for providing the output signal having the desired polarity to the output drive means 17.

The transistor means 37 for setting the polarity of the logic signal on line 12 operates as follows. When the programmable signal on line 15 is low, the first dual collector transistor 38 is disabled, while the second dual collector transistor 39 is enabled to respond to the logic signal on line 12. As the logic signal on line 12 goes high when the programmable signal on line 15 is low, the output signal on line 16 likewise goes low, thereby inverting the logic signal on line 12. As the logic signal on line 12 goes low, when the programmable signal on line 15 is likewise low, both the first and second dual collector transistors 38, 39 are off causing the output on line 16 to go high, thus inverting the logic signal from line 12.

In the opposite state, when the programmable signal on line 15 is high, the second dual collector transistor 39 is disabled because the logic signal on line 12 never goes high enough to turn it on. However, the first dual collector transistor 38 is enabled to respond to the logic signal on line 12. Thus, when the programmable signal is high, and the logic signal on line 12 is high, the first dual collector transistor 38 is turned off because the difference between the high logic signal on line 12 and the high programmable signal on line 15 is insufficient to turn on the first dual collector transistor 38. Thus, the signal on line 16 goes high. However, when the logic signal swings low, the first dual collector transistor 38 turns on causing the output on line 16 to likewise go low.

Thus it can be seen that the programmable signal on line 15 determines whether the polarity set means 13 inverts (low programmable signal) or does not invert (high programmable signal) the logic signal on line 12. In this manner, the polarity of the output signal on line 16 can be controlled.

The output driver means 17 receives the output signal on line 16 having the set polarity and drives the output signal on line 50 for communication to the user of the logic signal.

The output driver means 17 includes the first transistor 46. The base of transistor 46 receives the output signal on line 16. The collector of transistor 46 is connected through resistor 47 to the reference voltage $V_{cc}$. The emitter of the transistor 46 is connected through resistor 48 to ground.

The emitter of the transistor 46 is also connected to the base of a second transistor 49. The emitter of the transistor 46 is connected to the base of a third transistor 51. The collector of second transistor 49 is connected through a resistor to the reference voltage $V_{cc}$. The emitter of second transistor 49 is connected through a Shottky diode to an output node 52.

The emitter of the third transistor 51 is connected to ground. The collector of the third transistor 51 is connected to the output node 52.

The output driver means 17 in the embodiment shown in FIG. 2 inverts the output signal from line 16 having the set polarity. When the output signal on line 16 is low, first transistor 46 is off which causes second transistor 49 to turn on and the output on line 50 goes high. When the output signal on line 16 is high, the first transistor 46 is turned on causing the second transistor 49 to turn off and the third transistor 51 to turn on, drawing the output on line 50 low.

Accordingly, in order to have an active-high output, when the event sensed by the sensing means 11 is a high signal on line 30, the programmable signal on line 15 is programmed to be high. For opposite polarity, the programmable signal on line 15 is programmed low.

The programmable polarity select means 14, including override means 25 for testing the active-low mode and override means 26 for testing the active-high mode, is also shown in FIG. 2.

The means 21 for programming the programmable means 14 in this embodiment is the field programmable fuse 18. The field programmable fuse 18 is connected to node 90. The node 90 is connected across resistor 62 to the reference voltage $V_{cc}$. When the fuse 18 is blown, the signal at the node 90 is high. When the fuse 18 is not blown, the signal at the node 90 is low. The means 21 for programming is connected to node 61 of the programmable means 14 across diode 91, having its cathode at node 90.

The programmable means 14 is connected to the node 61 through a diode means 63 for setting a level for driving the programmable means 14. The diode means 63 includes in the embodiment shown in FIG. 2, a Shottky diode 64, a conventional diode 65 and another conventional diode 66. The node 61 is also connected through a resistor 92 to the reference voltage $V_{cc}$. Likewise, the node 61 is connected through Shottky diode 67 to the line 20 for testing the active-low operation of the apparatus 10 as discussed below. The cathode of the diode means 63 is connected to the node 68. Node 68 is connected to ground across resistor 69. Also, the node 68 is connected to the base of transistor 70. The emitter of transistor 70 is connected to ground. The collector of transistor 70 is connected across resistor 71 to the emitter of another transistor 72. Collector of the transistor 72 is connected to the reference voltage $V_{cc}$. The collector of the transistor 70 is connected to a node 73. Node 73 is connected through the Schottky diode 74 to the base of the transistor 72. The base of the transistor 72 is connected to the line 19 for providing a signal for testing the active-high operation of the apparatus 10 as discussed below.

The node 73 is also connected to the base of the transistor 75. The emitter of the transistor 75 is connected to ground. The collector of the transistor 75 is connected to the line 15 for providing a programmable signal.

The field programmable fuse 18 can be replaced with a variety of other means 21 for programming the programmable polarity select means 14. The means 21 provides a signal at the node 61. When the signal at the node 61 is high, transistor 70 turns on which draws the base of the transistor 75 low turning it off. This causes the programmable signal on line 15 to go high.

When the signal at node 61 is low, this takes base drive away from the transistor 70 so that its collector goes high. When the collector of transistor 70 goes high, the transistor 75 turns on drawing the programmable signal on line 15 low.

The override means 25 for testing the active-low mode in the embodiment of FIG. 2 operates as follows. When the active-low signal on line 20 is drawn low, the programmable signal on line 15 is forced low regardless of the condition of the means 21 for programming the programmable means 14. The active-low signal on line 20 is supplied by a testing circuit (not shown) on the device adapted to provide the signal.

The override means 26 for testing the active-high mode in the embodiment of FIG. 2 operates as follows. The active-high signal on line 19 is supplied by the testing circuit (not shown). If the testing circuit supplies a low signal on line 19, the base of transistor 72 is drawn low, which draws the base of transistor 75 low. Thereby, transistor 75 is turned off and the programmable signal on line 15 goes high.

The circuit shown in FIG. 2 provides both a programmable and a testable circuit for controlling the polarity of an output signal. In addition, the transistor means 37 in the polarity set means 13 operates very rapidly in either the active-high or active-low modes.

Figure 3:
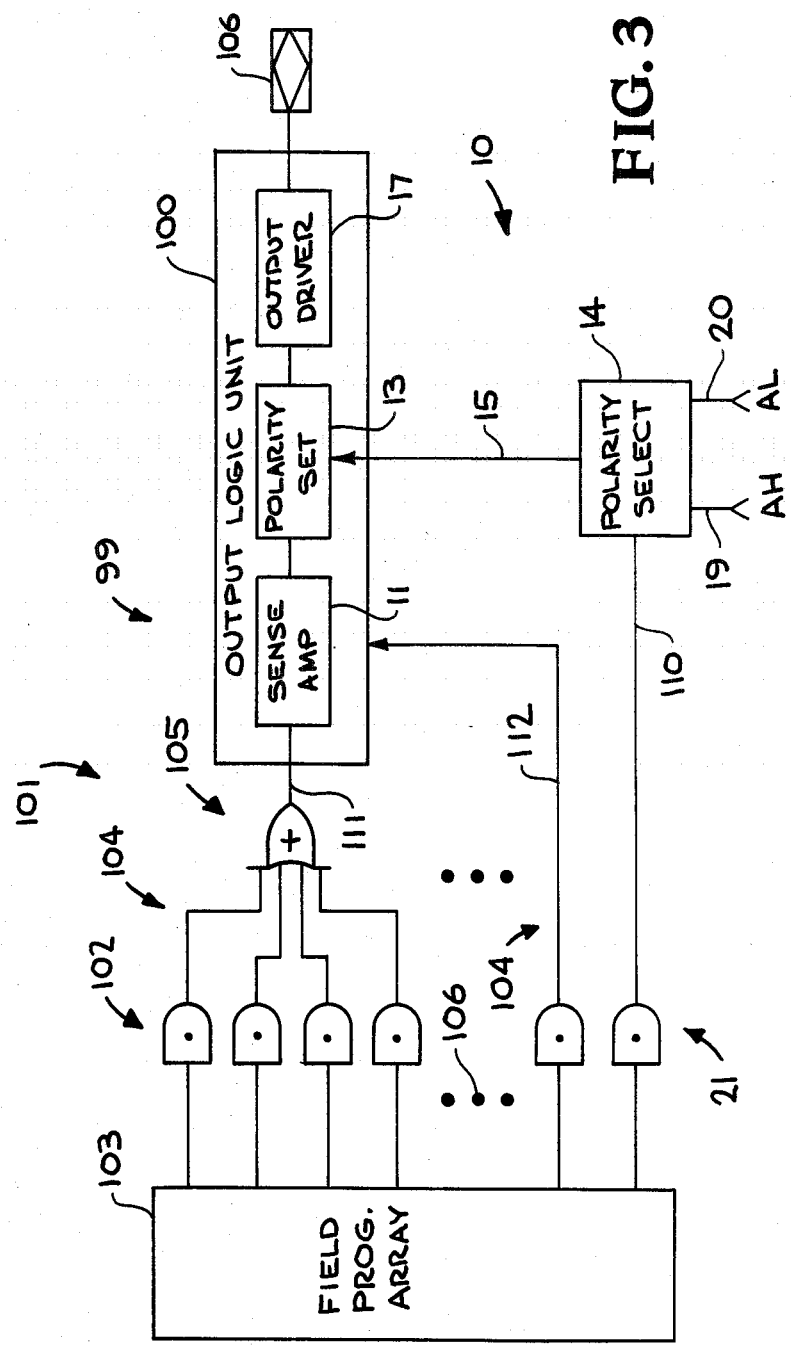
FIG. 3 is a schematic diagram of a logic circuit according to the present invention.

FIG. 3 shows schematically an implementation of the apparatus 10 in an integrated logic circuit 99 supplying a plurality of logic signals according to the present invention. The apparatus 10 is included as a portion of the output logic unit 100 on a field programmable logic array device 101.

The field programmable logic array device 101 includes a plurality of AND gates 102. As indicated by the ellipse 106, there may be a large number of AND gates 102 providing logic signals called "product terms" as output on lines 104. The inputs to the AND gate are determined by the field programmable array 103. The details of operation of the exemplary field programmable array can be determined from field programmable logic devices currently available in the marketplace. For instance, the assignee of the present invention, Advanced Micro Devices, Inc., in Sunnyvale, Calif., produces a device designated AmPAL16L8 and provides product literature therewith describing the operation of the field programmable array.

The product terms on lines 104 generated as output from the plurality of AND gates 102 may be supplied as input to a plurality of OR gates 105, only one of which is shown in FIG. 3 for the purposes of illustration. The output of the OR gate on line 111 is one of the plurality of logic signals called a "sum-of-product terms".

The field programmable logic array device 101 is one example of a circuit which generates a plurality of logic signals, such as the product terms and sum-of-product terms mentioned above. In the embodiment shown in FIG. 3, a product term on line 110 is supplied as the means 21 for programming the programmable means 14. The sum-of-product terms on line 111 is supplied as the event "E" to which the output signal is to respond. The output signal is supplied to an I/O pin 106 on the programmable logic array device.

The output logic device 100 may include a variety of other features responsive to the logic signals generated by the field programmable logic device 101. For instance, a product term 112 may be used for dynamic control of the output logic unit and a variety of other functions.

The circuit depicted in FIG. 3 is a programmable array logic device 101 generating a plurality of logic signals that includes at least one apparatus for setting the output polarity of an output signal supplied to an I/O pin 16. The apparatus 10 for setting the output polarity comprises the programmable polarity setting means 14, the sensing means 11, the polarity setting means 13, and the output driver means 17 as discussed with reference to FIG. 2. The event E which generates the output signal is a sum-of-product terms supplied over line 111 to the sensing means 11. The means 21 for programming the programmable polarity selecting means 14 is a product term supplied over 110.

Though the figure shows only one apparatus 10 for controlling the output polarity of an I/O pin 106, the signal on line 110 from the means 21 for programming the programmable means 14 may be supplied to a plurality of apparatus 10 corresponding to a number of I/O pins (not shown) on the programmable logic array device 99.

As indicated by line 19 for supplying the active-high test signal and the line 20 for supplying the active-low test signal, the circuit shown in FIG. 3 also includes the means for testing the active-high mode and the active-low mode as discussed with reference to FIGS. 1 and 2.

The apparatus 10 for controlling the output polarity of the I/O pin 106 according to the present invention is particularly useful in the programmable logic array device 101. This is true particularly because the apparatus 10 operates very rapidly, is testable, and increases the flexibility of design for a user of the programmable logic array device 99.

The foregoing description of a preferred embodiment of the invention has been presented for purposes of illustration and description. It is not intended to be exhaustive or to limit the invention to the precise form disclosed, and obviously many modifications and variations are possible in light of the above teaching. The programmable logic array embodiment was chosen and described in order to best explain the principles of the invention and it is a practical application to thereby enable others skilled in the art to best utilize the invention in various embodiments and with various modifications as are suited to the particular use contemplated. It is intended that the scope of the invention be defined by the claims appended hereto.

We claim:

1. An apparatus for generating an output signal in response to an event, comprising:
    sensing means for generating a logic signal upon occurrence of the event;
    programmable means for supplying a programmable signal indicating a selected output polarity of active-high or active-low;
    override means, coupled to said programmable means and being responsive to a test signal applied to said override means, to force said programmable signal to indicate either active-high or active-low in response solely to said test signal and independently of said selected output polarity; and
    polarity set means, receiving the logic signal and the programmable signal, for providing the output signal equal to the logic signal with the selected output polarity.

2. The apparatus of claim 1, further including:
    output driver means for driving the output signal.

3. The apparatus of claim 1, wherein said programmable means includes:
    means for programming the programmable means to provide the programmable signal.

4. The apparatus of claim 1, wherein said programmable means includes:
    logic means for dynamically programming the programmable means to provide the programmable signal.

5. The apparatus of claim 1, wherein said programmable means includes:
    a field-programmable fuse for programming the programmable means to provide the programmable signal.

6. The apparatus of claim 1, wherein said override means comprises:
    an active-high input terminal coupled to said programmable means for connection to a source of test voltage, said programmable means responding to a logic low voltage at said active-high terminal by supplying said programmable signal indicating active-high output polarity; and
    an active-low input terminal coupled to said programmable means for connection to a source of test voltage, said programmable means responding to a logic low voltage at said active-low terminal by supplying said programmable signal indicating active-low output polarity.

7. In a circuit generating a plurality of logic signals, an apparatus for setting output polarity, comprising:
    programmable means for supplying a programmable signal indicating a selected output polarity of active-high or active-low;
    override means, coupled to said programmable means and being responsive to a test signal applied to said override means, to force said programmable signal to indicate either active-high or active-low in response solely to said test signal and independently of said selected output polarity; and
    at least one polarity setting means, receiving one of the plurality of logic signals and the programmable signal, for producing an output signal equal to the received logic signal with the selected output polarity.

8. The apparatus of claim 7, further including:
    output driver means for driving the output signal for communication with other logic circuitry.

9. The apparatus of claim 7, wherein said programmable means includes:
    logic means for dynamically programming the programmable means to provide the programmable signal.

10. The apparatus of claim 7, wherein said programmable means includes:
    a field-programmable fuse for selectively programming said programmable means to provide the programmable signal.

11. The apparatus of claim 7, wherein said programmable means includes:
    means for receiving one of the plurality of logic signals to program said programmable means to provide the programmable signal.

12. The apparatus of claim 7, wherein the circuit generating a plurality of logic signals is a programmable logic array device.

13. The apparatus of claim 7, wherein said override means comprises:
    an active-high input terminal coupled to said programmable means for connection to a source of test voltage, said programmable means responding to a logic low voltage at said active-high terminal by supplying said programmable signal indicating active-high output polarity; and
    an active-low input terminal coupled to said programmable means for connection to a source of test voltage, said programmable means responding to a logic low voltage at said active-low terminal by supplying said programmable signal indicating active-low output polarity.

14. In a programmable logic array device, an apparatus for generating an output signal in response to a logic event, comprising:
    sensing means for generating a logic signal in response to the logic event;
    programmable means for supplying a programmable signal indicating a selected output polarity of active-high or active-low;

transistor means, receiving the logic siganl and the programmable signal, for providing the output signal equal to the logic signal with the selected output polarity;

means for programming said programmable means to provide the selected programmable signal;

override means, coupled to said programmable means and being responsive to a test signal applied to said override means, to force said programmable signal to indicate either active-high or active-low in response solely to said test signal and independently of said selected output polarity; and output driver means for driving the output signal.

15. The apparatus of claim 14, wherein said means for programming the programmable means includes:

a field-programmable fuse having an open-circuit condition and closed-circuit condition so that the open-circuit condition of the programmable fuse indicates one selected output polarity and the closed-circuit condition of the programmable fuse indicates the other selected output polarity.

16. The apparatus of claim 14, wherein said means for programming the programmable means includes:

logic means for dynamically programming the programmable means to provide the programmable signal.

17. The apparatus of claim 14, wherein said override means comprises:

an active-high input terminal coupled to said programmable means for connection to a source of test voltage, said programmable means responding to a logic low voltage at said active-high terminal by supplying said programmable signal indicating active-high output polarity; and an active-low input terminal coupled to said programmable means for connection to a source of test voltage, said programmable means responding to a logic low voltage at said active-low terminal by supplying said programmable signal indicating active-low output polarity.

* * * * *